United States Patent
Rathore et al.

(10) Patent No.: US 11,966,626 B2
(45) Date of Patent: Apr. 23, 2024

(54) HYBRID TERABYTES WRITTEN (TBW) STORAGE SYSTEMS

(71) Applicant: Western Digital Technologies, Inc., San Jose, CA (US)

(72) Inventors: Ratan Singh Rathore, Bangalore (IN); Ajay Shyam Manwani, Nagpur (IN)

(73) Assignee: Western Digital Technologies, Inc., San Jose, CA (US)

(*) Notice: Subject to any disclaimer, the term of this patent is extended or adjusted under 35 U.S.C. 154(b) by 48 days.

(21) Appl. No.: 17/743,926

(22) Filed: May 13, 2022

(65) Prior Publication Data
US 2023/0367507 A1    Nov. 16, 2023

(51) Int. Cl.
*G06F 3/06* (2006.01)
(52) U.S. Cl.
CPC .......... *G06F 3/0655* (2013.01); *G06F 3/0604* (2013.01); *G06F 3/0679* (2013.01)
(58) Field of Classification Search
CPC ...... G05B 13/00–048; G05B 15/00–02; G05B 17/00–02; G06F 1/00–3296; G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 18/00–41; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902;
(Continued)

(56) References Cited

U.S. PATENT DOCUMENTS

| 5,671,388 A | * | 9/1997 | Hasbun | ................... | G11C 11/56 |
| | | | | | 711/E12.008 |
| 7,948,798 B1 | * | 5/2011 | Sheredy | ................. | G06F 3/064 |
| | | | | | 365/185.11 |

(Continued)

OTHER PUBLICATIONS

SLC vs. MLC Performance: Quick Guide; Delkin Blog; Nov. 26, 2020; retrieved from https://web.archive.org/web/20201126230929/https://www.delkin.com/blog/slc-vs-mlc-performance-quick-guide/ on Aug. 24, 2023 (Year: 2020).*

(Continued)

*Primary Examiner* — Daniel C. Chappell
(74) *Attorney, Agent, or Firm* — Armstrong Teasdale LLP

(57) ABSTRACT

In one example, a flash storage device includes a flash memory and a controller. The flash memory includes non-volatile memory cells organized into blocks. The blocks are switchable between multi-bit mode and single-bit mode for storing data. The blocks in single-bit mode have a lower storage density and a higher write endurance than the blocks in multi-bit mode. The controller is configured to receive a write request from a host, and to determine whether a trigger event has occurred to switch one or more of the blocks from multi-bit mode to single-bit mode. Based on the controller determining that the trigger event has occurred, the controller is further configured to switch the one or more blocks from multi-bit mode to single bit mode, and to store, in single-bit mode, data for the write request in the one or more blocks at the lower data storage density.

20 Claims, 4 Drawing Sheets

(58) Field of Classification Search
CPC .... G06F 2212/00–7211; G06F 2213/00–4004;
G06F 2216/00–17; G06F 2221/00–2153;
G06N 3/00–126; G06N 5/00–048; G06N
7/00–08; G06N 10/00; G06N 20/00–20;
G06N 99/00–007; G06T 1/00–60; G06V
30/00–43; G11B 20/00–24; G11B
33/00–1493; G11C 11/00–5692; G11C
13/00–06; G11C 14/00–009; G11C
15/00–06; G11C 16/00–3495; G11C
17/00–18; G11C 2207/00–229; G11C
2216/00–30; H01L 25/00–50; H01L
2225/00–1094; H03M 7/00–707; H04L
9/00–38; H04L 12/00–66; H04L
41/00–5096; H04L 49/00–9094; H04L
61/00–59; H04L 67/00–75
See application file for complete search history.

(56) References Cited

U.S. PATENT DOCUMENTS

| | | | | |
|---|---|---|---|---|
| 2008/0172520 A1* | 7/2008 | Lee | ............... | G11C 11/5628 |
| | | | | 711/E12.001 |
| 2009/0119353 A1* | 5/2009 | Oh | ............... | G06F 3/0679 |
| 2009/0129155 A1* | 5/2009 | Honda | ............... | G11C 16/10 |
| | | | | 365/185.09 |
| 2010/0049904 A1* | 2/2010 | Chen | ............... | G11C 16/0483 |
| | | | | 711/E12.001 |
| 2010/0122016 A1* | 5/2010 | Marotta | ............... | G11C 16/16 |
| | | | | 711/E12.001 |
| 2010/0125699 A1* | 5/2010 | Kong | ............... | G11C 16/26 |
| | | | | 711/E12.001 |
| 2010/0146227 A1* | 6/2010 | Tsai | ............... | G06F 3/0605 |
| | | | | 711/E12.001 |
| 2010/0169541 A1* | 7/2010 | Freikorn | ............... | G06F 12/0246 |
| | | | | 711/E12.001 |
| 2011/0110164 A1* | 5/2011 | Jeong | ............... | G11C 29/02 |
| | | | | 365/185.23 |
| 2012/0173827 A1* | 7/2012 | Wood | ............... | G11C 11/5621 |
| | | | | 711/E12.001 |
| 2012/0240012 A1* | 9/2012 | Weathers | ............... | G11C 29/52 |
| | | | | 714/E11.034 |
| 2017/0192695 A1* | 7/2017 | Xu | ............... | G06F 3/0644 |
| 2019/0018598 A1* | 1/2019 | Hung | ............... | G06F 12/0246 |
| 2019/0163620 A1* | 5/2019 | Muthiah | ............... | G06F 9/3013 |
| 2019/0332327 A1* | 10/2019 | Ji | ............... | G06F 3/0659 |
| 2021/0073119 A1* | 3/2021 | Amaki | ............... | G06F 3/0613 |
| 2021/0382630 A1* | 12/2021 | Kobayashi | ............... | G06F 3/0658 |

OTHER PUBLICATIONS

Definition of flash memory, Margaret Rouse, Sep. 2005, retrieved from http://searchstorage.techtarget.com/definition/flash-memory on May 15, 2014 (1 page) (Year: 2005).*

P. Deshmukh and A. M. Sapkal, "Impact of file systems on SSD PE cycle consumption," 2017 International Conference on Intelligent Computing and Control Systems (ICICCS), Madurai, India, 2017, pp. 311-314, doi: 10.1109/ICCONS.2017.8250733. (Year: 2017).*

* cited by examiner

HYBRID TERABYTES WRITTEN (TBW) STORAGE SYSTEMS

BACKGROUND

Flash storage devices (e.g., solid state disks (SSDs) are typically advertised at a single defined storage capacity along with a terabytes written (TBW) rating that specifies the number of terabytes that can be written to the SSD before it is likely to become unreliable. The defined storage capacity is based on the type of flash cells in the blocks (e.g., single level cell (SLC), multi-level cell (MLC), triple level cell (TLC) or quad level cell (QLC)) along with the number of blocks per die and the number of dies used in the flash storage device. TBW is based on the storage capacity and the endurance (e.g., the number of program/erase (P/E) cycles) of the flash cells, which depends on the type of flash cells in the blocks.

Typically, after the storage device exceeds the TBW rating, the flash storage device may be considered unreliable. For example, an SSD that exceeds its TBW rating may no longer be supported by the manufacturer's warranty. As a result, when an SSD exceeds its TBW rating, the SSD may need to be replaced. In an enterprise storage solution, SSD replacement is a major factor in the ongoing costs associated with providing the storage solution.

Accordingly, it would be advantageous to continue utilizing a flash storage device past its initial TBW rating.

SUMMARY

The present application describes a flash storage device that dynamically switches the flash block type from its native multi-bit mode (e.g., MLC/TLC/QLC or a higher bit-per cell mode) to single-bit mode (also referred to herein as SLC mode) in response to a trigger event (e.g., after the rated TBW of the flash storage device is reached). As a result, the flash storage device may continue to operate past its TBW rating at a reduced storage capacity which extends the life of the flash storage device.

The endurance of the flash cells in SLC mode is significantly higher (e.g., >100,000 program/erase (P/E) cycles) as compared to the endurance of the flash cells in their native multi-bit mode. For example, QLC flash cells may have an endurance of only about 1,000 P/E cycles. However, even after 1,000 P/E cycles, switching QLC flash blocks to SLC mode may still enable at least another 90,000 P/E cycles. While the capacity of the flash storage device in SLC mode is reduced as compared to its native multi-bit mode, the flash storage device can continue to operate reliably even after the TBW rating of the flash storage device is exceeded, which reduces the total cost of ownership of the flash storage device.

Accordingly, the present application describes a flash storage device that includes a flash memory and a controller. The flash memory includes non-volatile memory cells organized into blocks, where the blocks are switchable between a multi-bit mode for storing data in the non-volatile memory cells and a single-bit mode for storing the data in the non-volatile memory cells. The blocks in the single-bit mode have a lower storage density and a higher write endurance than the blocks in the multi-bit mode. The controller is communicatively coupled to the flash memory and is configured to receive a write request from a host, and to determine whether a trigger event has occurred to switch one or more of the blocks from the multi-bit mode to the single-bit mode. Based on the controller determining that the trigger event has occurred, the controller is further configured to switch the one or more blocks from the multi-bit mode to the single bit mode, and to store, in the single-bit mode, data for the write request in the one or more blocks at the lower data storage density.

The present application further describes a method of dynamically switching blocks of a flash memory of a flash storage device from a multi-bit mode to a single-bit mode for storing data in non-volatile memory cells of the blocks. The method includes receiving a write request from a host, and determining whether a trigger event has occurred to switch one or more of the blocks from the multi-bit mode to the single-bit mode, where the one or blocks in the single-bit mode have a lower storage density and a higher write endurance than the one or more blocks in the multi-bit mode. Based on determining that the trigger event has occurred, the method further includes switching the one or more blocks from the multi-bit mode to the single-bit mode, and storing, in the single-bit mode, data for the write request in the one or more blocks at the lower data storage density.

The present application further describes a flash storage device that includes a flash memory having non-volatile memory cells organized into blocks, where the blocks are switchable between a multi-bit mode for storing data in the non-volatile memory cells and a single-bit mode for storing the data in the non-volatile memory cells. The blocks in the single-bit mode have a lower storage density and a higher write endurance than the blocks in the multi-bit mode. The flash storage device further includes a means for monitoring an amount of data written to the blocks of the flash memory, and a means for determining if the amount of data written to the blocks is greater than a threshold amount of data. Based on determining that the amount of data written to the blocks is greater than the threshold amount of data, the flash storage device further includes a means for notifying a host of an option to switch one or more of the blocks from the multi-bit mode to the single-bit mode for storing data at the flash device.

BRIEF DESCRIPTION OF THE DRAWINGS

Non-limiting and non-exhaustive examples are described with reference to the following Figures.

DETAILED DESCRIPTION

Figure 1:
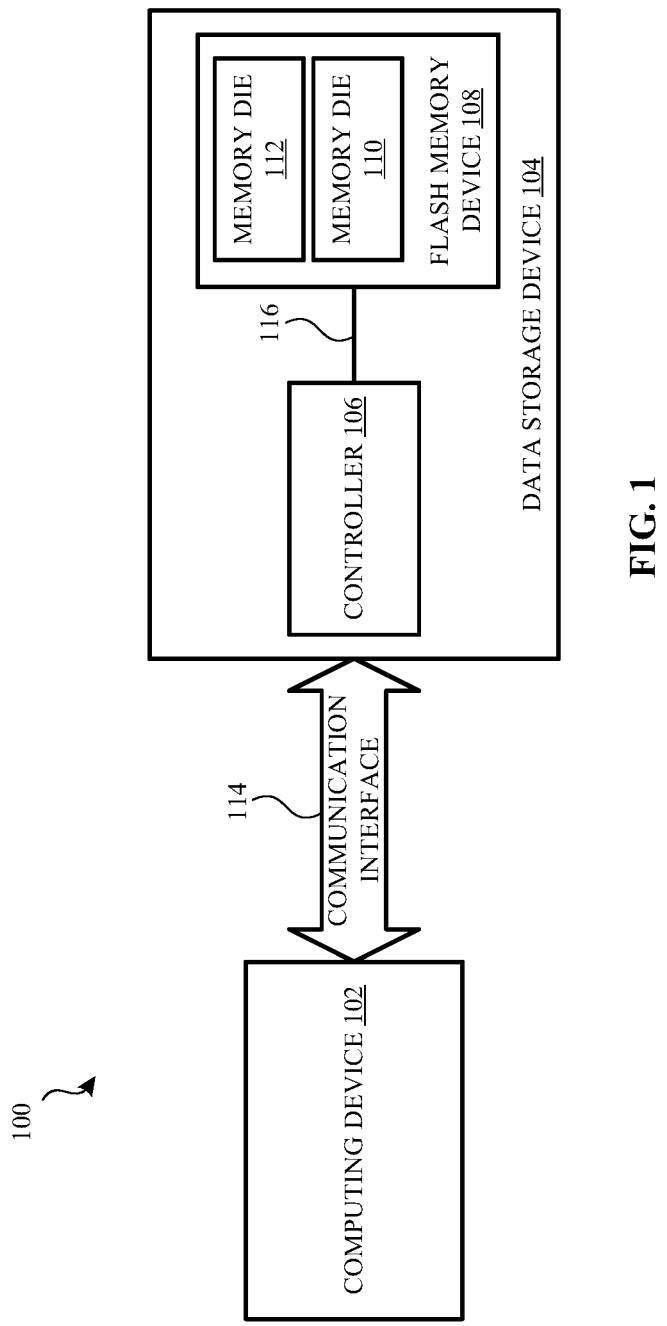
FIG. 1 is a block diagram of a data storage system according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Examples may be practiced as methods, systems or devices. Accordingly, examples may take the form of a hardware implementation, an entirely software implementation, or an implementation combining software and hardware aspects. The following detailed description is therefore not to be taken in a limiting sense, and the scope of the present disclosure is defined by the appended claims and their equivalents.

Many commonly used data storage devices, such as SSDs, are based on flash memory which is a type of Non-Volatile Random-Access Memory (NVRAM) capable of storing data even if the power to the device is switched off. A memory cell within a flash memory may be a floating gate field-effect transistor or a charge trap material that holds a charge to indicate stored data. In SLC flash cells (single-bit cells), the charge indicates one of two possible states ("1" or "0") such that a single memory cell stores one bit of data. By contrast, MLC flash uses two bits per cell, TLC uses 3 bits per cell, and QLC uses 4 bits per cell to store data. However, current progress in the evolution of flash memory most likely will continue to increase the number of bits per cell in flash memory over time, with the benefit of a higher per-die memory capacity at the expense of a lower P/E endurance.

The storage capacity of multi-bit mode flash cells is significantly higher than SLC flash cells, with the tradeoff being that the endurance of multi-bit mode flash cells is significantly lower than SLC flash cells.

Typically, flash storage devices include one or more dies (e.g., one, two, four), each of which may operate independently. Each of the dies may include one or more planes (typically two or four) in which concurrent operations may take place, and each of the planes may include a number of blocks (e.g., dozens or hundreds), which in turn may each contain a number of flash pages (e.g., 8, 16, 32, 64).

Generally, in flash architectures, a block represents the smallest unit that may be erased in a single erase operation, and a flash page may represent the smallest unit that may be programmed (i.e., written to) or read in a single write or read operation. Each flash page may include thousands or tens of thousands of bits, with each bit implemented by a flash memory cell. Some flash devices support dynamically switching a flash block from multi-bit mode to SLC mode (also referred to herein as single-bit mode), which reduces the storage capability for the flash pages in the block, but increases the endurance and performance of the memory cells in the block.

In some cases, switching a block from multi-bit mode to SLC mode or vice versa is temporarily performed during wear leveling by the Flash Translation Layer (FTL). However, this activity is not performed to modify the overall capacity of the flash storage device or the TBW rating of the flash storage device. In other cases, switching a block from multi-bit mode to SLC mode is performed during normal operation to improve the performance of the flash storage device. For example, the flash storage device may be designed to dedicate some percentage of the total blocks (e.g., ten percent) to SLC mode operation, as SLC mode provides a higher performance than multi-bit mode.

In this type of configuration, the subset of blocks on the flash storage device dedicated to SLC mode are used as a high-performance data buffer for incoming data from the host system. However, this type of configuration is not dynamically performed to modify the overall capacity of the flash storage device or the TBW rating of the flash storage device but rather, is included in the initial specified capacity and TBW rating of the flash storage device when it is sold to an end user.

Thus, as discussed above, once a flash storage device exceeds its TBW rating, the reliability of the flash storage device is no longer guaranteed, and the flash storage device is typically replaced. Therefore, it would be advantageous to continue utilizing a flash storage device past its initial TBW rating, even if the storage capacity is reduced, as doing so extends the useful life of the flash storage device.

In the examples described herein, a flash storage device operates based on its initial multi-bit mode, TBW rating, and capacity until a trigger event is identified that directs the flash storage device to convert one or more of its flash blocks from multi-bit mode to SLC mode, at a reduced capacity. The trigger event may be, for example, a command sent from a host system to the flash storage device. In another example, the trigger event may be when the TBW of the flash storage device is approximately equal to the TBW rating of the flash storage device in its initially configured multi-bit mode. In another example, the trigger event may be based on a number of P/E cycles for the blocks in the flash memory of the flash storage device. In yet another example, the trigger event may be based on the error rate of the flash storage device.

Flash memory devices exhibit bit errors that are typically corrected by error-correction codes (ECC). Bit errors can occur due to various mechanisms, such as read-disturb errors, write errors, retention errors, etc. In some cases, the error rate of flash memory device can increase over time. For example, flash cells near the end of their P/E endurance may exhibit more bit errors than flash cells near the beginning of their P/E endurance. Bit errors may be classified as correctable or uncorrectable. Correctable bit errors are resolved using ECC or some other mechanisms, while uncorrectable bit errors are not correctable. The uncorrectable bit error rate (UBER) is a metric for data corruption rate that is equal to the number of data errors per bit read after applying an error correction method. Either the raw bit error rate for the flash storage device, the UBER, or some combination of both, may be used as a trigger when switching flash blocks from multi-bit mode to SLC mode.

As the storage capacity of the flash storage device is significantly less in SLC mode than in multi-bit mode, data stored by the flash storage device may be lost during conversion from multi-bit mode to SLC mode. Thus, the flash storage device may coordinate with the host system during the transition from multi-bit mode to SLC mode to prevent data loss. For example, the flash storage device may inform the host system that converting to SLC mode may be an option, based on the TBW to the flash storage device being equal to, exceeding, or being within a threshold amount of, the TBW rating of the flash storage device as initially specified when the flash storage device operates in its multi-bit mode. When converting the flash storage device from multi-bit mode to SLC mode, the flash storage device may be essentially wiped of data. Thus, the host may re-write a subset of the data back to the flash storage device after the conversion, as the flash storage device capacity after conversion is less than before conversion.

The ability for the flash storage device to dynamically convert from multi-bit mode to SLC mode enables the flash storage device to remain in service at a reduced storage capacity, which reduces the total cost of ownership of the flash storage device. Further, the performance of the flash storage device in SLC mode is higher than when the flash storage device is in multi-bit mode. As such, converting the flash storage device to SLC mode near the end of its TBW rating also improves the performance of the flash storage device. In some cases, the change may cause the flash storage device to have a lower overall capacity.

Further, once the flash storage device is converted to SLC mode, the flash storage device may report a new TBW rating to the host system, for tracking the extended lifetime of the flash storage device. The new TBW rating is based, at least in part, on the higher endurance made available by converting blocks to SLC mode. The host system may be, for example, a server, which utilizes the flash storage device to persistently store data, or some other entity such as a generalized computing device (e.g., a smart phone, a tablet, etc.) which includes flash dies that dynamically convert blocks from multi-bit mode to SLC mode.

In some examples, the flash storage device dynamically converts blocks from multi-bit mode to SLC mode without presenting a lower storage capacity to the host. For example, the flash storage device may normally report a lower capacity to the host system than is possible, due to overprovisioning. When overprovisioning is used on the flash storage device, a percentage of the maximum available storage at the flash storage device is reserved for use during wear leveling and error handling. The flash storage device may report a capacity to the host that is lower than the maximum possible capacity during normal operation. Thus, the flash storage device may, in some examples, dynamically convert blocks from multi-bit mode to SLC mode while reducing the amount of overprovisioning, which maintains the usable storage space presented to the host by the flash storage device. During this process, the flash storage device may copy data from multi-bit blocks to new blocks of the flash storage device before switching the blocks from multi-bit mode to single-bit mode, to prevent data loss.

This process may occur based on one or more of the trigger events previously described for converting flash blocks from multi-bit mode to SLC mode. For instance, reaching a P/E threshold on a block in multi-bit mode may trigger the flash storage device to convert the block to SLC mode, which results in the block having a higher P/E endurance. This enables the block to be used for additional P/E cycles at a lower storage capacity by reducing the amount of overprovisioning in the flash storage device. In another example, an error rate of a block in multi-bit mode being greater than a threshold error rate may trigger the flash storage device to convert the block to SLC mode, which may result in the block having a subsequently lower error rate. This enables the block to be used for storing data at a lower capacity by reducing the amount of overprovisioning in the flash storage device.

Accordingly, the present application has many technical benefits including, but not limited to, increasing the lifespan of the flash storage device past its initial TBW rating. Another technical benefit includes improving the performance of the flash storage device after block conversion to SLC mode, due to the higher performance of flash devices in SLC mode as compared to multi-bit mode. Another technical benefit includes reducing the overall total cost of ownership of the flash storage device.

These various benefits and examples will be described in greater detail below with reference to FIG. 1-FIG. 4.

FIG. 1 depicts a block diagram of a data storage system 100 in an example. In this example, data storage system 100 includes a computing device 102 and a data storage device 104. Data storage device 104 may be part of or otherwise integrated with computing device 102. In another example, data storage device 104 may be separate from, or otherwise external to, computing device 102. Data storage device 104 may be any type of data storage device, drive, module, component, and/or system. In one example, data storage device 104 comprises a hybrid hard drive, which includes both rotating magnetic media and flash memory. In another example, data storage device 104 comprises an SSD. In another example, data storage device 104 comprises any type of removable or non-removable memory module. In one example, data storage device 104 may have limited resources (e.g., limited RAM and/or storage capability) based on, for example, an end product that utilizes data storage device 104 and/or data storage system 100 to store data.

In this example, data storage device 104 includes a controller 106. Controller 106 comprises any system, component, or device that performs the functions described herein for the data storage device 104. In an example, controller 106 includes control circuitry, processing circuitry, software, firmware, or a combination thereof. For example, controller 106 may include one or more processors, volatile or non-volatile memory devices, data and/or power transmission channels/paths, boards, and the like in order to perform the various functions and features described herein.

Controller 106 may be implemented as a system-on-a-chip (SoC), a field-programmable gate array (FPGA), an application-specific integrated circuit (ASIC), and the like. In another example, controller 106 (or the various components of controller 106) may be mounted on a printed circuit board (PCB). Controller 106 may be configured to receive and/or send various commands with computing device 102. For example, controller 106 may receive, execute and/or send various commands (e.g., read, write, and/or erase commands) in order to perform aspects of the various examples described herein. Controller 106, in this example, dynamically switches data storage device 104 from multi-bit mode to SLC mode in response to different trigger events occurring, as well as performing other processes and operations described herein.

Data storage device 104 in this embodiment includes a flash memory device 108 (e.g., non-volatile memory). Flash memory device 108 (and/or portions of flash memory device 108) may also be referred to as a storage medium. Flash memory device 108 includes a number of storage elements. In an example, each storage element is a chip or a memory die that is used to store data. In the example shown in FIG. 1, flash memory device 108 includes memory dies 110, 112, although flash memory device 108 includes a different number of memory dies in other examples. In an example, memory dies 110, 112 include non-volatile memory elements such as, for example, NAND flash memory elements and/or NOR flash memory elements. In one example, memory dies 110, 112 comprise solid-state memory such as, for example, 2D NAND, 3D NAND memory, SLC memory, MLC memory, TLC memory, QLC memory or any combination thereof. Further, memory dies 110, 112 may operate independently of each other. Memory dies 110, 112 may include one or more planes (not shown) in which concurrent operations may take place, and each of the planes may include a number of blocks, not shown, (e.g., dozens or hundreds), which in turn may each contain a number of flash pages, not shown (e.g., 8, 16, 32, 64, etc.). Each of the blocks of memory dies 110, 112 may be independently operated in multi-bit mode or SLC mode, as desired. For example, controller 106 may selectively configure some or all of the blocks of memory dies 110, 112 independently of each other between multi-bit mode and SLC mode as desired.

In the example depicted in FIG. 1, controller 106 communicates with computing device 102 via a communication interface 114. Communication interface 114 may include hardware such as, for example, wires, pins, traces, connectors, software, firmware, or a combination thereof. Examples of communication interface 114 include Small Computer System Interface (SCSI), Serial Attaches SCSI (SAS), Serial AT Attachment (SATA), Fibre Channel (FC), Integrated Drive Electronics (IDE), Peripheral Component Interconnect Express (PCIe), M.2, Universal Serial Bus (USB), Non-Volatile Memory Host Controller Interface Specification (NVMHCI), NVM Express, etc.

Communication interface 114 is used to transmit various commands between computing device 102 and controller 106. The commands may include data access commands, data storage commands and the like. For example, controller 106 may receive commands from computing device 102 via communication interface 114 and implement the commands on flash memory device 108. In this example, controller 106 is coupled to flash memory device 108 via an interface 116 (e.g., one or more lines, pins, wires, traces). In an example, each channel of interface 116 may be coupled to different portions of flash memory device 108 (e.g., each channel of interface 116 may be coupled to different planes of memory dies 110, 112).

Figure 2:
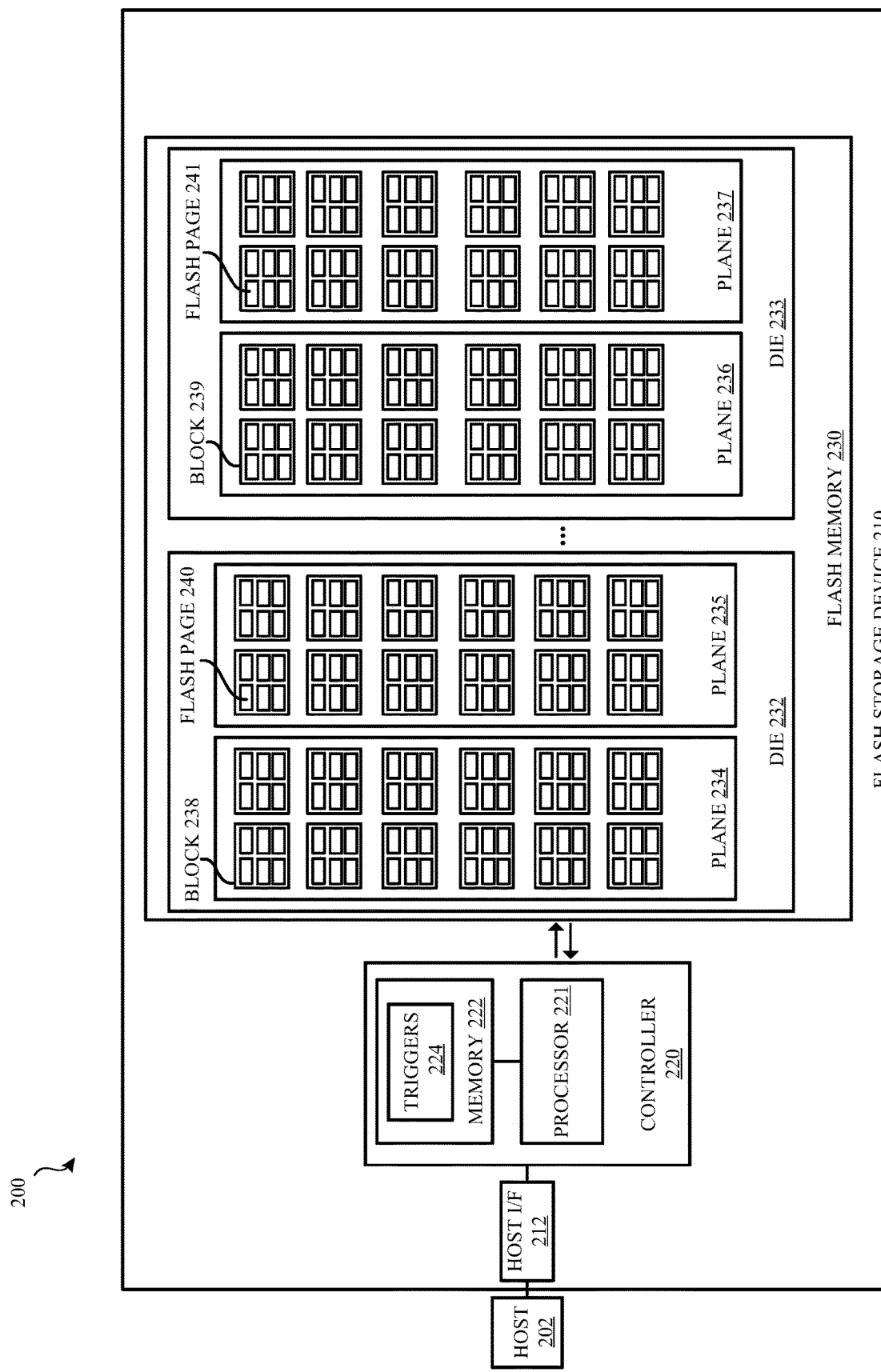
FIG. 2 is a block diagram of another data storage system according to another example.

FIG. 2 is a block diagram of a system 200 that includes a flash storage device 210 in an example. In this example, system 200 includes a host 202 (e.g., a computer system, a mobile phone) that issues I/O commands to flash storage device 210. In this example, flash storage device 210 also includes a host interface 212. Host interface 212 provides a communication connection to facilitate communication of data, commands, and/or control signals between host 202 and flash storage device 210. Some examples of host interface 212 include SCSI, SAS, SATA, FC, IDE, PCIe, M.2, USB, NVMHCI, NVM Express, etc. In this regard, host interface 212 comprises any component, system, or device that allows host 202 to communicate with flash storage device 210.

In this example, flash storage device 210 further includes a controller 220. Controller 220 includes any electronic circuits and/or optical circuits that are able to perform functions. For example, controller 220 may perform any function described herein that is attributed to flash storage device 210. In this regard, controller 220 comprises any system, component, or device that is able to control the operations of flash storage device 210. While the specific hardware implementation of controller 220 is subject to design choices, one particular example may include one or more processors 221 communicatively coupled with a memory 222. Processor 221 includes any electronic circuits and/or optical circuits that are able to perform functions. For example, processor 221 may perform any functionality described herein for controller 220. Processor 221 may include one or more Central Processing Units (CPU), microprocessors, Digital Signal Processors (DSPs), Application-specific Integrated Circuits (ASICs), Programmable Logic Devices (PLD), control circuitry, etc. Some examples of processor 221 include INTEL® CORE™ processors, Advanced Reduced Instruction Set Computing (RISC) Machines (ARM®) processors, etc.

Memory 222 includes any electronic circuits, and/or optical circuits, and/or magnetic circuits that are able to store data. For instance, memory 222 may be used to store programmed instructions that are executed by processor 221 to perform any of the functions described herein for controller 220, may be used to store triggers 224 which will be discussed later. Memory 222 may include one or more volatile or non-volatile Dynamic Random-Access Memory (DRAM) devices, flash devices, volatile or non-volatile Static RAM devices, etc. Some examples of non-volatile DRAM and SRAM include battery-backed DRAM and battery-backed SRAM.

In this example, flash storage device 210 further includes a flash memory 230. Flash memory 230 comprises any component, system, or device that is able to store data in a non-volatile manner. Some examples of flash memory 230 include NAND-type flash, NOR-type flash, SLC flash, MLC flash, dynamically reconfigurable multi-bit to single-bit flash, etc.

In some examples, flash memory 230 comprises one or more dies 232, 233 (e.g., one, two, four, etc.), each of which may operate independently. Each of dies 232, 233 may include one or more planes 234-237 (typically two or four) in which concurrent operations may take place, and each of planes 234-237 may include a number of blocks 238, 239 (e.g., dozens or hundreds), which in turn may each contain a number of flash pages 240, 241 (e.g., 8, 16, 32, 64, etc.). Generally, in flash architectures, a block (e.g., block 238) represents the smallest unit that may be erased in a single erase operation, and a flash page (e.g., flash page 240) may represent the smallest unit that may be programmed (i.e., written to) or read in a single write or read operation. Each flash page 240 may include thousands or tens of thousands of bits, with each bit implemented by a non-volatile memory cell.

In this example, blocks 238, 239 are selectable between multi-bit mode (e.g., MLC, TLC, QLC) and a single-bit mode (e.g., SLC mode) for storing data. Blocks 238, 239 in single-bit mode have a lower data storage density and a higher write endurance than blocks 238, 239 in multi-bit mode. During normal operation, blocks 238, 239 are operated in multi-bit mode to maximize the storage available at flash storage device 210. During normal operation, controller 220 receives write requests from host 202, and stores, in multi-bit mode, data at blocks 238, 239 (e.g., at flash pages 240, 241) based on the write requests.

During operation, controller 220 may identify one or more triggers 224, described in more detail below, which directs controller 220 to convert or switch one or more of blocks 238, 239 from multi-bit mode to single-bit mode. As a result, for subsequent write requests received from host 202, data may be stored, in single-bit mode, at blocks 238, 239 (e.g., at flash pages 240, 241), at a lower data storage density. In some examples, controller 220 calculates a new storage capacity of flash storage device 210 based on the one or more blocks 238, 239 that were converted from multi-bit mode to single-bit mode. For example, converting block 238 from QLC to SLC reduces the data storage density of block 238 by one quarter, although the write endurance of block 238 is much higher in SLC mode. As a result, controller 220 may re-calculate the storage capacity, based on the lower data storage capacity of block 238.

As briefly described above, flash storage device 210 operates based on its initial multi-bit mode, TBW rating, and capacity until trigger(s) 224 occur that direct controller 220 of flash storage device 210 to convert one or more of blocks 238, 239 from multi-bit mode to single-bit mode, at a reduced capacity. Triggers 224 may be, for example, a command sent from host 202 to controller 220 (e.g., via host interface 212) of flash storage device 210.

In another example, triggers 224 are related to the expected P/E rating of blocks 238, 239. In this example, controller 220 tracks the P/E cycles for blocks 238, 239, and dynamically converts one or more of blocks 238, 239 from multi-bit mode to single-bit mode. As the P/E specification of blocks 238, 239 is significantly higher in single-bit mode than in multi-bit mode, the conversion of one or more of blocks 238, 239 from multi-bit mode to single-bit mode enables blocks 238, 239 to continue to support additional P/E cycles well past their initial P/E specification (e.g., when blocks 238, 239 operated in multi-bit mode).

In another example, triggers 224 are related to the expected TBW rating of flash memory 230. Generally, the TBW rating of flash memory 230 is based on the P/E rating of blocks 238, 239 and the storage capacity of blocks 238, 239. In this example, controller 220 tracks the TBW for flash memory 230 and dynamically converts one or more of blocks 238, 239 from multi-bit mode to single-bit mode, since the P/E specification of blocks 238, 239 is significantly higher in single-bit mode than in multi-bit mode.

The conversion of one or more of blocks 238, 239 from multi-bit mode to single-bit mode enables blocks 238, 239 to continue to support additional P/E cycles well past their initial P/E specification when blocks 238, 239 were operated in their multi-bit mode, thereby supporting a higher TBW rating for flash memory 230. Although the data storage density for blocks 238, 239 is less in single-bit mode as compared to multi-bit mode, the number of rated P/E cycles is significantly higher, which results in a significantly higher TBW rating for flash memory 230 after conversion. In this example, controller 220 may calculate a new TBW rating for flash memory 230, and provide this new TBW rating to host 202.

Figure 3:
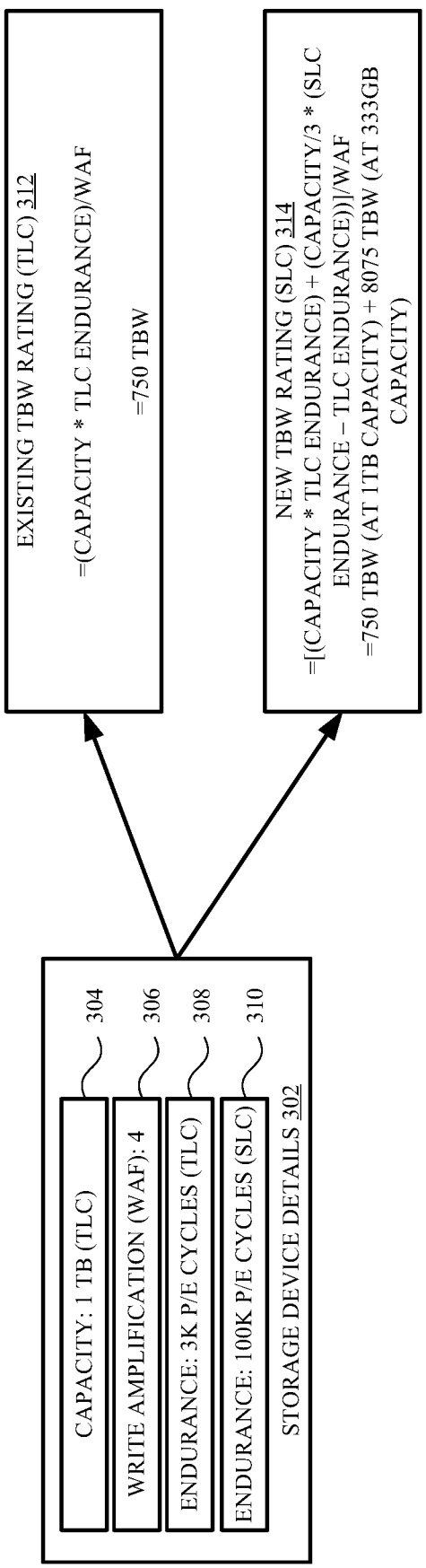
FIG. 3 depicts TBW calculations when converting a flash storage device from multi-bit mode to single-bit mode in an example.

FIG. 3 depicts TBW calculations when converting a flash storage device from multi-bit mode to single-bit mode in an example. In the example, storage device details 302 for a flash storage device (e.g., flash storage device 210) may have a capacity 304 of 1 Terabyte (TB) when in multi-bit mode (TLC in this example), a write amplification 306 value of 4, an endurance 308 in multi-bit mode of 3,000 P/E cycles, and an endurance 310 in SLC mode of 100,000 P/E cycles.

Generally, write amplification (WAF) is a phenomenon associated with flash where the actual amount of information physically written to the storage device is a multiple amount of the logical amount of data intended to be written. WAF occurs because data is written to flash in pages, while data is erased in flash in blocks of pages. Thus, resolving stale data in pages in a block may entail reading valid pages and re-writing the valid pages to a new block, so the original block can be erased. The result is that valid data may be re-written multiple times in order to manage both current data and stale data in the same block of pages.

In the example shown in FIG. 3, the existing TBW rating for a flash storage device based on storage device details 302 is 750 TBW, which is a function of capacity 304, WAF 306, and endurance 308 in multi-bit mode. However, once 750 TB is written to the flash storage device and it is converted from multi-bit mode to SLC mode, a new TBW rating 314 is a function of capacity 304, WAF 306, and endurance 310 in SLC mode. New TBW rating, in the example, is 750 TBW+8075 TBW at a lower capacity of 333 GB.

In another example and referring back to FIG. 2, triggers 224 are related to an acceptable error rate of blocks 238, 239. In this example, controller 220 tracks the error rate for blocks 238, 239 for flash memory 230, and dynamically converts one or more of blocks 238, 239 from multi-bit mode to single-bit mode if the error rate is greater than a threshold error rate. The conversion of one or more of blocks 238, 239 from multi-bit mode to single-bit mode enables blocks 238, 239 to continue to support data storage activities because the error rate for blocks 238, 239 in single-bit mode is less than the error rate of blocks 238, 239 in multi-bit mode, due to the smaller number of threshold voltages used to represent data in multi-bit mode.

As briefly discussed above, controller 220 may dynamically convert one or more of blocks 238, 239 from multi-bit mode to single-bit mode without the result of a lower storage capacity presented to host 202 in some examples. For example, controller 220 may normally report a lower storage capacity to host 202 than is possible, due to overprovisioning. When overprovisioning is used on flash storage device 210, a percentage of the maximum available storage at flash storage device 210 is reserved for use during wear leveling and error handling by controller 220, such that controller 220 reports to host 202 a lower than maximum storage size during normal operation. Thus, controller 220 may, in some examples, dynamically convert one or more of blocks 238, 239 from multi-bit mode to single-bit mode while dynamically reducing the amount of overprovisioning at flash storage device 210, which maintains the usable storage space to host 202 for flash storage device 210. This process may occur based on one or more triggers 224 previously described that direct controller 220 to convert one or more of blocks 238, 239 from multi-bit mode to single-bit mode.

Figure 4:
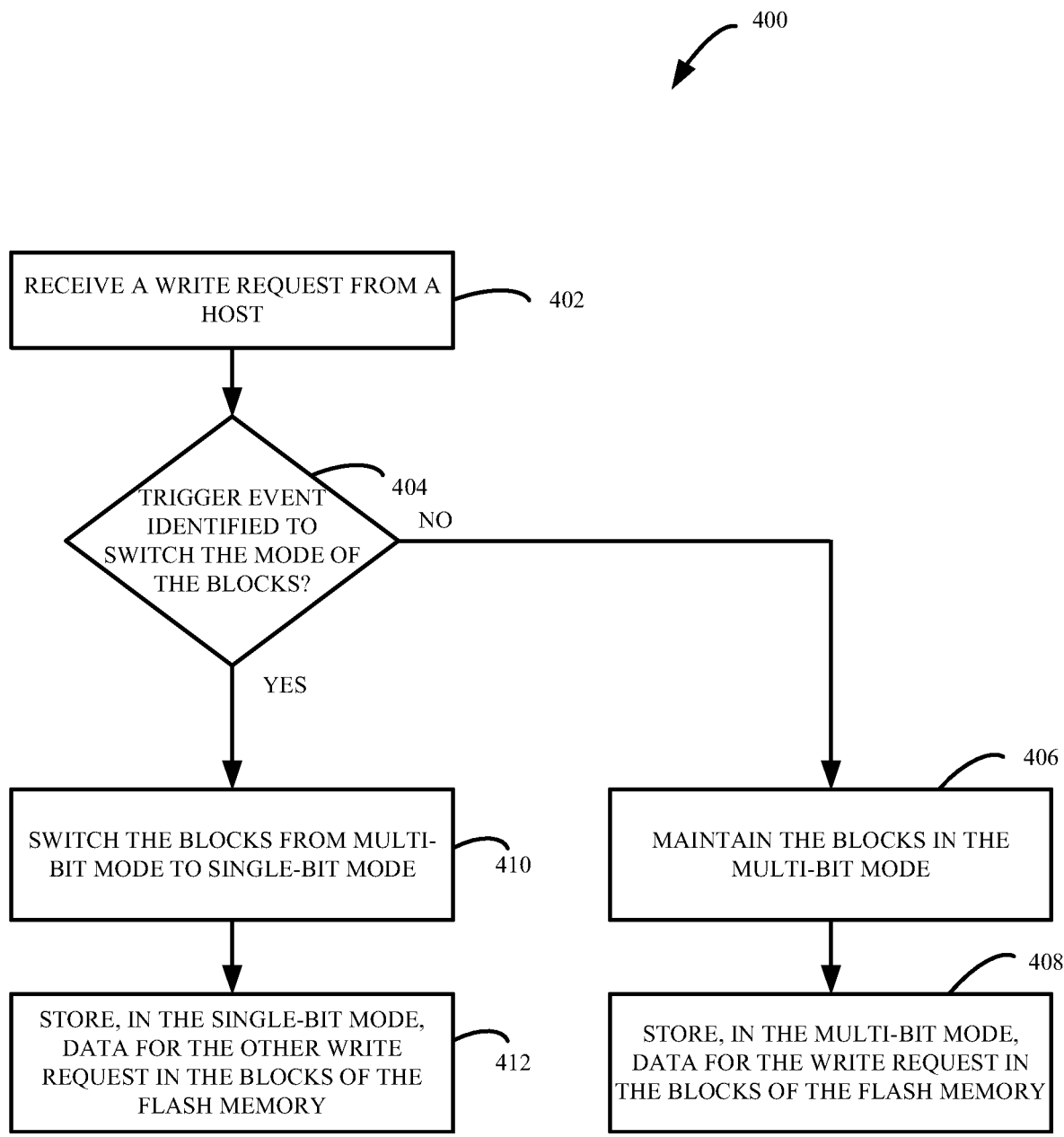
FIG. 4 illustrates a method of dynamically switching blocks of a flash memory of a flash storage device from multi-bit mode to single-bit mode in an example.

FIG. 4 illustrates a method 400 of dynamically switching blocks of a flash memory of a flash storage device from multi-bit mode to single-bit mode according to an example. Method 400, or various operations of method 400, may be performed by one or more systems shown and described with respect to FIG. 1 and/or FIG. 2.

Method 400 begins when the flash storage device receives (402) a write request from a host. For example, host 202 may transmit one or more write requests to flash storage device 210 via host interface 212 (see FIG. 2). The write requests may include, for example, data sent by host 202 for persistent storage at flash storage device 210.

Method 400 continues as flash storage device determines (404) whether a trigger event has occurred to switch one or more of the blocks of the flash memory of the flash storage device from multi-bit mode to single-bit mode, where the one or more blocks in single-bit mode have a lower data storage density and a higher write endurance than the one or more blocks in multi-bit mode. The trigger event may be detected, for example, based on any of the triggers previously described. For example, controller 220 of flash storage device 210 may review triggers 224 stored in memory 222 to determine whether a trigger event has occurred (see FIG. 2).

If trigger event has not occurred, then method 400 continues and the flash storage device maintains (406) multi-bit mode for the blocks, and stores (408), in multi-bit mode, data for the write request from the host in blocks of the flash memory. For example, if controller 220 determines, after reviewing triggers 224, that no trigger event has occurred, then controller 220 writes the data received from host 202 to one or more flash pages 240, 241 in flash memory 230, in multi-bit mode (see FIG. 2).

However, if a trigger event has occurred, then method 400 continues and the flash storage device switches (410) one or more of the blocks of the flash memory of the flash storage device from multi-bit mode to single-bit mode. The flash storage device then stores (412), in single-bit mode, data for the write request in the one or more blocks of the flash memory at the lower data storage density. For example, if controller 220, after reviewing triggers 224, determines that a trigger event has occurred, then controller 220 switches one or more of blocks 238, 239 from multi-bit mode to single-bit mode, and writes the data received from host 202 to one or more of blocks 238, 239, in single-bit mode (see FIG. 2).

In an example, method 400 further includes receiving a command from the host to switch the one or more blocks from multi-bit mode to single-bit mode based, at least in part, on determining that the triggering even has occurred.

For instance, host 202 may transmit a command to controller 220, via host interface 212, that directs controller 220 to switch one or more of blocks 238, 239 from multi-bit mode to single-bit mode (see FIG. 2).

In another example, method 400 further includes determining that a number of PIE cycles of the one or more blocks is greater than a threshold number of P/E cycles based, at least in part, on determining the trigger event has occurred. For instance, controller 220 may track P/E cycles for one or more of blocks 238, 239, and triggers 224 may include a threshold number of P/E cycles which directs controller 220, when the number of tracked P/E cycles exceeds a threshold number of P/E cycles, to switch one or more of blocks 238, 239 from multi-bit mode to single-bit mode (see FIG. 2).

In another example, method 400 further includes determining that an amount of data written to the flash storage device is greater than a threshold amount of data based, at least in part, on determining the trigger event has occurred. For instance, controller 220 may track the amount of data written to flash storage device 210, and triggers 224 may include a threshold amount of data which causes controller 220 to switch one or more of blocks 238, 239 from multi-bit mode to single-bit mode (see FIG. 2).

In another example, method 400 further includes calculating a new TBW of the flash storage device based, at least in part, on the lower data storage density and the higher write endurance of the one or more blocks when in single-bit mode, and notifying the host of the new TBW rating of the flash storage device. For instance, controller 220 may calculate a new TBW rating of flash storage device 210 based on the lower storage density of blocks 238, 239 switched to single-bit mode and also based on the higher P/E endurance of blocks 238, 239 in single-bit mode. Controller 220 may then notify host 202 of the new TBW rating of flash storage device 210 (see FIG. 2).

In yet another example, method 400 further includes calculating a new storage capacity of the flash storage device based, at least in part, on the lower data storage density of the one or more blocks when in single-bit mode, and notifying the host of the new storage capacity. For instance, controller 220 may calculate a new storage capacity of flash storage device 210 based on the lower storage density of blocks 238, 239 switched to single-bit mode. Controller 220 may then notify host 202 of the new storage capacity of flash storage device 210 (see FIG. 2).

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, an analog computer, a programmable logic controller (PLC), an application specific integrated circuit (ASIC), and other programmable circuits, and these terms are used interchangeably herein. In the embodiments described herein, "memory" may include, but is not limited to, a computer-readable medium, such as a random-access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a touchscreen, a mouse, and a keyboard. Alternatively, other computer peripherals may also be used that may include, for example, but not be limited to, a scanner. Furthermore, in the example embodiment, additional output channels may include, but not be limited to, an operator interface monitor or heads-up display. Some embodiments involve the use of one or more electronic or computing devices. Such devices typically include a processor, processing device, or controller, such as a general-purpose central processing unit (CPU), a graphics processing unit (GPU), a microcontroller, a reduced instruction set computer (RISC) processor, an ASIC, a programmable logic controller (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are not intended to limit in any way the definition and/or meaning of the term processor and processing device.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks. Additionally, it is contemplated that the flowcharts and/or aspects of the flowcharts may be combined and/or performed in any order.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A flash storage device, comprising:
   a flash memory having non-volatile memory cells organized into blocks, wherein the blocks are switchable between a multi-bit mode for storing data in the non-volatile memory cells and a single-bit mode for storing the data in the non-volatile memory cells, wherein the blocks in the single-bit mode have a lower data storage density and a higher write endurance than the blocks in the multi-bit mode; and
   a controller communicatively coupled to the flash memory, the controller configured to:
      receive a write request from a host;
      based, at least in part, on receiving the write request, determine whether a trigger event has occurred to switch one or more blocks from the multi-bit mode to the single-bit mode; and
   based, at least in part, on the controller determining the trigger event has occurred:
      switch the one or more blocks from the multi-bit mode to the single-bit mode;
      store, in the single-bit mode, data associated with the write request in the one or more blocks at the lower data storage density;
      calculate a new terabyte written (TBW) rating of the flash storage device based, at least in part, on the lower data storage density and the higher write endurance of the one or more blocks when in the single-bit mode; and
      notify the host of the new TBW rating of the flash storage device.

2. The flash storage device of claim 1, wherein the trigger event comprises receiving, by the controller, a command from the host to switch the one or more blocks from the multi-bit mode to the single-bit mode.

3. The flash storage device of claim 1, wherein the trigger event comprises determining, by the controller, that a number of program/erase (P/E) cycles of the one or more blocks is greater than a threshold number of P/E cycles.

4. The flash storage device of claim 1, wherein the trigger event comprises determining, by the controller, that an amount of data written to the flash storage device is greater than a threshold amount of data.

5. The flash storage device of claim 1, wherein the controller is further configured to:
   calculate a new storage capacity of the flash storage device based, at least in part, on the lower data storage density of the one or more blocks when in the single-bit mode; and
   notify the host of the new storage capacity.

6. The flash storage device of claim 1, wherein the trigger event comprises determining, by the controller, that an error rate of the flash storage device is greater than a threshold error rate.

7. The flash storage device of claim 1, wherein switching the one or more blocks from the multi-bit mode to the single-bit mode comprises reducing an amount overprovisioned blocks of the flash storage device.

8. A method of dynamically switching memory blocks of a storage device from a multi-bit mode to a single-bit mode for storing data in non-volatile memory cells of the memory blocks, comprising:
   receiving a write request from a host;
   based, at least in part, on receiving the write request, determining whether a trigger event has occurred to switch one or more of the memory blocks from the multi-bit mode to the single-bit mode, wherein the one or more memory blocks in the single-bit mode have a lower data storage density and a higher write endurance than the one or more memory blocks in the multi-bit mode;
   based, at least in part, on determining that the trigger event has occurred:
      switching the one or more memory blocks from the multi-bit mode to the single-bit mode;
      storing, in the single-bit mode, data associated with the write request in the one or more memory blocks at the lower data storage density;
      calculating a new terabyte written (TBW) rating of the flash storage device based, at least in part, on the lower data storage density and the higher write endurance of the one or more memory blocks when in the single-bit mode; and
      notifying the host of the new TBW rating of the flash storage device.

9. The method of claim 8, further comprising receiving a command from the host to switch the one or more memory blocks from the multi-bit mode to the single-bit mode based, at least in part, on determining the trigger event has occurred.

10. The method of claim 8, wherein determining the trigger event has occurred comprises determining that a number of program/erase (P/E) cycles of the one or more memory blocks is greater than a threshold number of P/E cycles.

11. The method of claim 8, wherein determining the trigger event has occurred comprises determining that an amount of data written to the flash storage device is greater than a threshold amount of data.

12. The method of claim 8, wherein switching the one or more memory blocks from the multi-bit mode to the single-bit mode comprises reducing an amount of overprovisioned memory blocks of the flash storage device.

13. The method of claim 8, further comprising:
calculating a new storage capacity of the flash storage device based, at least in part, on the lower data storage density of the one or more memory blocks when in the single-bit mode; and
notifying the host of the new storage capacity.

14. The method of claim 8, wherein determining that the trigger event has occurred comprises determining that an error rate of the flash storage device is greater than a threshold error rate.

15. A flash storage device, comprising:
a flash memory having non-volatile memory cells organized into blocks, wherein the blocks are switchable between a multi-bit mode for storing data in the non-volatile memory cells and a single-bit mode for storing the data in the non-volatile memory cells, wherein the blocks in the single-bit mode have a lower data storage density and a higher write endurance than the blocks in the multi-bit mode;
means for monitoring an amount of data written to the blocks of the flash memory;
means for receiving a command;
based, at least in part, on receiving the command, means for determining whether the amount of data written to the blocks is greater than a threshold amount of data;
based, at least in part, on determining that the amount of data written to the blocks is greater than the threshold amount of data, means for notifying a host of an option to switch one or more of the blocks from the multi-bit mode to the single-bit mode for storing data at the flash storage device;
means for calculating a new terabyte written (TBW) rating of the flash storage device based, at least in part, on the one or more blocks being switched from the multi-bit mode to the single-bit mode; and
means for notifying the host of the new TBW rating of the flash storage device.

16. The flash storage device of claim 15, further comprising:
means for receiving a command from the host to switch the one or more blocks from the multi-bit mode to the single-bit mode; and
based, at least in part on receiving the command, means for switching the one or more blocks from the multi-bit mode to the single-bit mode for storing the data at the flash storage device.

17. The flash storage device of claim 16, further comprising:
means for calculating a new storage capacity of the flash storage device based, at least in part, on the lower data storage density of the one or more blocks when in the single-bit mode; and
means for notifying the host of the new storage capacity.

18. The flash storage device of claim 15, further comprising:
means for monitoring a number of program/erase (P/E) cycles for the blocks;
means for determining if the number of P/E cycles is greater than a threshold number of P/E cycles; and
based, at least in part, on determining that the number of P/E cycles is greater than the threshold number of P/E cycles, means for notifying the host of the option to switch the one or more blocks from the multi-bit mode to the single-bit mode for storing the data at the flash storage device.

19. The flash storage device of claim 15, further comprising:
means for monitoring an error rate of the blocks;
means for determining if the error rate of the blocks is greater than a threshold error rate; and
based, at least in part, on determining that the error rate is greater than the threshold error rate, means for notifying the host of the option to switch the one or more blocks from the multi-bit mode to the single-bit mode for storing data at the flash storage device.

20. The flash storage device of claim 15, further comprising means for reducing an amount of overprovisioned blocks of the flash storage device.

* * * * *